(12) United States Patent
Ebel et al.

(10) Patent No.: US 10,896,986 B2
(45) Date of Patent: Jan. 19, 2021

(54) SOLAR CELL STACK

(71) Applicant: AZUR SPACE Solar Power GmbH, Heilbronn (DE)

(72) Inventors: Lars Ebel, Eisingen (DE); Wolfgang Guter, Stuttgart (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 252 days.

(21) Appl. No.: 16/014,554

(22) Filed: Jun. 21, 2018

(65) Prior Publication Data

US 2018/0374973 A1 Dec. 27, 2018

(30) Foreign Application Priority Data

Jun. 21, 2017 (DE) .......................... 10 2017 005 950

(51) Int. Cl.
*H01L 31/043* (2014.01)
*H01L 31/0304* (2006.01)
(Continued)

(52) U.S. Cl.
CPC ...... *H01L 31/043* (2014.12); *H01L 31/03046* (2013.01); *H01L 31/047* (2014.12); *H01L 31/0687* (2013.01); *H01L 31/0735* (2013.01)

(58) Field of Classification Search
CPC ........... H01L 31/0304; H01L 31/03042; H01L 31/03044; H01L 31/03046;
(Continued)

(56) References Cited

U.S. PATENT DOCUMENTS

| | | |
|---|---|---|
| 6,933,539 B1 | 8/2005 | Bhat et al. |
| 2014/0196773 A1 | 7/2014 | Bedell et al. |

(Continued)

FOREIGN PATENT DOCUMENTS

| | | |
|---|---|---|
| DE | 102012004734 A1 | 9/2013 |
| DE | 102015016047 A1 | 6/2017 |

(Continued)

OTHER PUBLICATIONS

Guter, W. (u.a.): Investigation and development of III-V-triple-junction concentrator solar cells. In: $22^{nd}$ European Photovoltaic Solar Energy Conference, EU PVSEC; proceedings of the international conference, Sep. 3-7, 2007, Milan, Italy. 2007, S. 122-125. ISBN 3-936338-22-1.

(Continued)

*Primary Examiner* — Eric R Smith
(74) *Attorney, Agent, or Firm* — Muncy, Geissler, Olds & Lowe, P.C.

(57) ABSTRACT

Solar cell stack comprising III-V semiconductor layers, which includes a first subcell having a first band gap and a first lattice constant and which includes a second subcell having a second band gap and a second lattice constant, and which includes an intermediate layer sequence disposed between the two solar cells. The intermediate layer sequence including a first barrier layer and a first tunnel diode and a second barrier layer, and the layers being arranged in the specified order. The tunnel diode includes a degenerate n+ layer having a third lattice constant and a degenerate p+ layer having a fourth lattice constant, the fourth lattice constant being smaller than the third lattice constant, and the first band gap being smaller than the second band gap, and the p+ layer having a different material composition than the n+ layer.

19 Claims, 5 Drawing Sheets

(51) Int. Cl.
*H01L 31/0687* (2012.01)
*H01L 31/047* (2014.01)
*H01L 31/0735* (2012.01)

(58) Field of Classification Search
CPC ......... H01L 31/03048; H01L 31/06875; H01L 31/0693; H01L 31/0735
See application file for complete search history.

(56) References Cited

U.S. PATENT DOCUMENTS

| | | |
|---|---|---|
| 2015/0034153 A1* | 2/2015 | Sato .................... H01L 31/1844 136/255 |
| 2015/0053257 A1 | 2/2015 | Dimroth et al. |
| 2017/0077340 A1* | 3/2017 | Sato .................. H01L 31/06875 |
| 2017/0084771 A1 | 3/2017 | Chiu et al. |
| 2017/0170354 A1 | 6/2017 | Ebel et al. |

FOREIGN PATENT DOCUMENTS

| | | |
|---|---|---|
| EP | 2251912 A1 | 11/2010 |
| JP | H0964386 A | 3/1997 |

OTHER PUBLICATIONS

A.Bett et al, "Highest efficiency multijunction solar cell for terrestrial and space applications," in 24$^{th}$ European Photovoltaic Solar Energy Conference + Exhibition, Sep. 21-25, 2009, Hamburg, Germany, Session 1AP.1.1, pp. 1-6.

* cited by examiner

SOLAR CELL STACK

This nonprovisional application claims priority under 35 U.S.C. § 119(a) to German Patent Application No. 10 2017 005 950.0, which was filed in Germany on Jun. 21, 2017, and which is herein incorporated by reference.

BACKGROUND OF THE INVENTION

Field of the Invention

The present invention relates to a solar cell stack.

Description of the Background Art

A solar cell stack is known from W. Guter et al, "Investigation and development of III-V-triple-junction concentrator solar cells," in 22nd European Photovoltaic Solar Energy Conference, Sep. 3-7, 2007, Milan Italy, pp. 122-125.

A multijunction solar cell comprising a strain-compensated tunnel diode is known from A. Bett et al, "Highest efficiency multijunction solar cell for terrestrial and space applications," in 24th European Photovoltaic Solar Energy Conference and Exhibition, Sep. 21-25, 2009, Hamburg, Germany, Session 1AP.1.1, pages 1-6.

A stacked, monolithic multijunction solar cell having an improved current conduction between the solar cells is known from EP 2 251 912 A1. For this purpose, a tunnel diode having degenerate layers, strained with respect to each other, is disposed between two consecutive solar cells. A tensilely strained, degenerate layer is compensated by a compressively strained degenerate layer. The degenerate layers are designed as either carbon-doped degenerate p+ layers or as tellurium- or silicon-doped degenerate n+ layers. Due to the fact that the strain is compensated, no strain acts upon the layers surrounding the tunnel diode; in other words, the sum of the strain is zero.

In another specific embodiment, the layers immediately surrounding the tunnel diode, preferably barrier layers, and not the degenerate layers of the tunnel diode, are included for strain compensation. While the degenerate n+ layer is always unstrained and has the lattice constant of the directly abutting barrier layer, in the present case the degenerate p+ layer is always tensilely or compressively strained. Accordingly, the barrier layer abutting the degenerate p+ layer is compressively or tensilely strained. Due to the fact that the strain, in turn, is compensated, no strain acts upon the layers surrounding the barrier layer; in other words, the sum of the strain is zero.

The typical procedure for tunnel diode materials of new solar cell concepts having metamorphic buffers is to match the lattice of the tunnel diode layers to the substrate lattice constant or to the new, virtual substrate lattice constant in metamorphic structures. At the same time, the tunnel diode layers should have a sufficiently high doping for the current carrying capacity and a sufficiently high transparency for underlying subcells.

In the case of the strain-compensated tunnel diodes in the metamorphic solar cell concept having indium contents significantly greater than 5%, a large lattice constant difference occurs between the compensating, degenerate p+ and n+ layers, e.g. strain-compensated tunnel diode layers from EP 2 251 192 A1, so that the tensilely strained tunnel diode layer relaxes plastically and cracks. The resulting threading dislocations or even cracks may extend all the way to the p-n junction of adjacent subcells, where they act as centers for non-radiative recombination of the generated charge carriers, so that the efficiency of the multijunction solar cell is greatly reduced.

As is known from W. Guter et al, "Investigation and development of III-V triple-junction concentrator solar cells," in 22nd European Photovoltaic Solar Energy Conference, Sep. 3-7, 2007, Milan Italy, pp. 122-125, a degenerate p+ layer, made up of AlInGaAs, having a high In content in metamorphic multijunction solar structures, results in an improved lattice constant matching to the virtual substrate. However, this material is difficult to p-dope, compared to AlGaAs. In the case of extrinsic doping with the aid of carbon tetrabromide (CBr4), preliminary reactions also occur in the MOVPE reactor, e.g. with TMIn, which results in a suppressed In integration and thus a poor lattice match.

The degenerate p+ layer subsequently relaxes plastically and generates threading dislocations or cracks and causes a reduction in the efficiency of the metamorphic multijunction solar cell.

(Al)GaAsSb is an alternative p-doped tunnel diode material. This material system may be matched to different lattice constants, due to the As/Sb ratio, and it may simultaneously be highly p-doped (e.g. intrinsic carbon or CBr4 doping). (Al)GaAsSb is thus used to manufacture lattice-matched tunnel diode structures. However, a special configuration of the MOVPE (metal-organic vapor phase epitaxy) reactor and special source materials are often needed for this material system, compared to arsenides and phosphides.

SUMMARY OF THE INVENTION

It is therefore an object of the present invention to provide a device which refines the prior art and, in particular, increases the efficiency of the metamorphic solar cells due to a better lattice match of the p+ layer and simultaneously reduces the current carrying capacity of the tunnel diode as little as possible.

According to an exemplary embodiment of the invention, a solar cell stack is provided that comprises a predominant number of III-V semiconductor layers, the solar cell stack includes a first subcell having a first band gap and a first lattice constant and a second subcell having a second band gap and a second lattice constant.

An intermediate layer sequence is disposed between the two solar cells. The intermediate layer sequence includes a first barrier layer and a first tunnel diode and a second barrier layer, the layers being arranged in the specified order.

The tunnel diode includes a degenerate n+ layer having a third lattice constant and a degenerate p+ layer having a fourth lattice constant, the fourth lattice constant being smaller than the third lattice constant, and the first band gap being smaller than the second band gap, and the p+ layer having a different material composition with indium as the n+ layer. The n+ layer is disposed between the first barrier layer and the p+ layer. The p+ layer is disposed between the n+ layer and the second barrier layer.

The first subcell and the second subcell can be lattice-matched to each other, and the p+ layer has a smaller lattice constant with a lattice mismatch of at least 0.5%.

A metamorphic buffer can be formed between the first subcell and the second subcell, the degenerate p+ layer of the tunnel diode not being lattice-matched to either the first subcell or the second subcell. The fourth lattice constant is preferably between the first lattice constant and the second lattice constant.

The third lattice constant of the degenerate n+ layer of the tunnel diode is lattice-matched to the first subcell or to the second subcell.

The degenerate p+ layer can have a different material combination than the degenerate n+ layer.

The degenerate p+ layer can contain at least 5% indium and carbon as the dopant.

The layers of the tunnel diode and the other layers of the intermediate layer sequence are not strain-compensated with respect to each other.

It should be noted that the term, lattice match, can be understood to be a difference of less than 0.1% in the lattice constants of two consecutive layers.

The term, "not strain-compensated," can be understood to mean that a strain is generated by the lattice mismatch of the degenerate p+ layer, and the strain is not compensated by the degenerate n+ layer or with the aid of the barrier layers.

In other words, the third lattice constant or the lattice constants of the two barrier layers can either be equal to the first lattice constant or equal to the second lattice constant.

The term, "predominately III-V semiconductor layers," can be understood to designate a multijunction solar cell in which more than 50%, preferably more than 80%, of its layers are made up of III-V materials.

A subcell of this type often comprises, in particular, a Ge subcell, the other subcells of the solar cell stack being made up of the III-V materials or compounds.

The term, subcell, can be used synonymously with the term, solar subcell. In other words, the solar cell stack is made up of multiple solar subcells, which are connected in series to each other with the aid of tunnel diodes.

The term, material composition, can be used to designate, for example, an InGaAs material composition, a compound of the specified elements, it being possible for other elements to be included in addition to the specified elements.

If layers are made up of a given material composition, dopants, such as zinc or carbon, can also be included in addition to the specified material composition, without the dopants being explicitly mentioned.

The term, degenerate layer, can be understood to be a highly doped tunnel diode layer. The term, degeneration, thus refers to the fact that the Fermi level of the n+ layer is in the conduction band, and the Fermi level of the p+ layer is in the valence band, i.e. the semiconductor layers have a metallic conductivity.

The layers immediately surrounding the tunnel diode, in particular the barrier layers, are not strained. In reference to the intermediate layer sequence, only the degenerate p+ layer of the tunnel diode is lattice-mismatched with respect to the barrier layers or with respect to at least one of the lattice constants of the subcells and therefore has a tensile strain. In other words, the barrier layers have the lattice constants of adjacent subcells.

It has surprisingly been shown, in contrast to the prior art, that the material of the degenerate p+ layer of a strained tunnel diode for metamorphic multijunction solar cells may be manufactured in such a way that, on the one hand, the lattice mismatch of the degenerate p+ layer is reduced by the integration of indium and a simultaneous intrinsic carbon doping, and on the other hand, the transparency and the electrical conductivity of the tunnel diode are not noticeably reduced.

In particular, a compromise may thus be reached between a sufficiently high lattice match and a sufficiently high p doping and a sufficiently high transparency of the p+ layer. The plastic relaxation of the p+ layer with the formation of dislocations or cracks may be avoided hereby, and the material quality of the adjacent subcells may be increased. In addition, the efficiency of the metamorphic multijunction solar cell is increased.

Another advantage is that the strain and thereby the curvature of the wafers may be reduced with the aid of the two alternatives. Due to the fact that the n+ layer is lattice-matched to one of the subcells or to both subcells, i.e. it has the same or nearly the same lattice constant as one subcell or as both subcells, a tensile strain emerges, always in sum, from the p+ layer of the tunnel diode and thereby from the intermediate layer sequence. This means that the p+ layer of the tunnel diode is tensilely strained, the surrounding layers being lattice-matched to one of the subcells or to both subcells and are thus unstrained.

In the present case, the strain is thus not compensated in the intermediate layer sequence but preferably at least partially by the other layers of the solar cell stack. An advantage is that the compressive strains incorporated during the epitaxy process both before the manufacture and after the manufacture of the intermediate layer sequence are at least partially compensated by the strain of the p+ layer.

Another advantage, is that an at least partial compensation may be carried out with the aid of the degenerate p+ layer of the tunnel diode, whose lattice constant is not lattice-matched to either the first subcell or to the second subcell, particularly during an integration of a metamorphic buffer between the first subcell and the second subcell and the residual strain of the wafer resulting from the integration of the buffer.

The degenerate p+ layer of the tunnel diode can have a lattice mismatch between 0.5% and 2.0% with respect to the degenerate n+ layer of the tunnel diode.

The degenerate p+ layer of the tunnel diode can be made up of a material composition of AlInGaAs, the carbon concentration in the material being greater than 1E19 cm-3. In another refinement, the indium content of the degenerate p+-conducting AlInGaAs layer of the tunnel diode is between 5% and 20%, the aluminum content of the degenerate p+-conducting layer being between 10% and 80%.

The lattice constant of the degenerate p+-conducting layer of the tunnel diode can be between 5,674 Å and 5,734 Å. The lattice constant can also be influenced by the indium content. In an exemplary embodiment, the degenerate p+ layer of the tunnel diode does not contain any antimony or up to a maximum of 5% antimony.

The degenerate n+-conducting layer of the tunnel diode can be made up of a compound of InGaP or AlInGaP or AlInP and is doped with tellurium, silicon, selenium or germanium, the lattice constant being between 5,714 Å and 5,785 Å. The indium content of the degenerate n+-conducting layer of the tunnel diode is preferably between 63% and 80%. The aluminum content is a maximum of 37%. The indium content for InAlP can be approximately a maximum of 63% and the aluminum content is approximately a maximum of 37%. The indium content for InAlP can be approximately 70% and the aluminum content can be approximately a maximum of 30%.

It is understood that the percentages of the specified indium and aluminum contents are related to the total content of the group-III atoms.

In the compound $Al_y In_x Ga_{1-x-y} As$, therefore, the indium content has the value X, and the aluminum content has the value Y, and this results, for example, in an X value of 0.15 for an indium content of 15% and a Y value of a maximum of 0.85 for an aluminum content of a maximum of 85%.

The solar cell stack can include a Ge or a GaAs substrate.

The Ge substrate can have an n-doped layer on its upper side, i.e. counter to the direction of light incidence. The Ge subcell can be formed as the bottom subcell.

The solar cell stack can comprise precisely three subcells, another tunnel diode being formed between the second subcell and the third subcell. It is understood that the strains of the two tunnel diodes are not compensated. Alternatively, only one of the two tunnel diodes can be strained. The tunnel diode between the second subcell and the third subcell is preferably not strained.

The strained tunnel diode is present once to twice in the stacked, upright, metamorphic, quadruple multijunction solar cell. It is understood that the strained tunnel diodes can each be disposed between two directly consecutive subcells. Three of the four subcells can be disposed above the metamorphic buffer. An unstrained tunnel diode can be formed between the bottom subcell and the metamorphic buffer.

The strained tunnel diode can be present once to three times in the stacked, upright, metamorphic, quadruple multijunction solar cell. One of the strained tunnel diodes can be situated between the metamorphic buffer and the subcell located above the metamorphic buffer. Three of the four subcells can be disposed above the metamorphic buffer, a strained tunnel diode can be disposed between adjacent subcells in each case. Individual strained tunnel diodes may, of course, be replaced by lattice-matched tunnel diodes or other tunnel diodes.

The strained tunnel diode can be present once to three times in the stacked, upright, metamorphic, quintuple multijunction solar cell and is situated between two subcells in each case, four of the five subcells being disposed above the metamorphic buffer. An unstrained tunnel diode can be formed between the bottom subcell and the metamorphic buffer. Individual strained tunnel diodes may, of course, be replaced by lattice-matched tunnel diodes or other tunnel diodes.

The strained tunnel diode can be present once to four times in a stacked, upright, metamorphic, quintuple multi-junction solar cell, four of the five subcells being disposed above the metamorphic buffer. The strained tunnel diode can be formed between the metamorphic buffer and the adjacent subcell and is situated between two adjacent subcells above the metamorphic buffer. Individual strained tunnel diodes may, of course, be replaced by lattice-matched tunnel diodes or other tunnel diodes.

The layers of the metamorphic buffer in the second specific embodiment can be made up of material compositions of InGaAs and/or AlInGaAs and/or InGaP, the metamorphic buffer having a sequence of at least three layers, and the lattice constant increasing from layer to layer in the sequence in the direction of the second subcell, and the lattice constants of the layers of the buffer being larger than the lattice constant of the first subcell, and one layer of the metamorphic buffer having a third lattice constant, and the third lattice constant being larger than the lattice constant of the second subcell. The metamorphic buffer can have a sequence of at least five layers or precisely five layers. For example, one of the layers in the metamorphic buffer can have a compressive strain.

In an example, the degenerate p+ layer of the tunnel diode is not strain-compensated by either a subsequent layer with respect to the tunnel diode or by a preceding layer with respect to the tunnel diode. It is understood that the term, subsequent layers, can be used to refer to layers which are deposited only after the p+ layer during the epitaxy process. The solar cell stack can have a monolithic structure.

It should be furthermore noted that the new type of tunnel diode, which generates a tensile strain, may be advantageously used in multijunction cells grown in an upright manner as well as those grown in an inverted manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
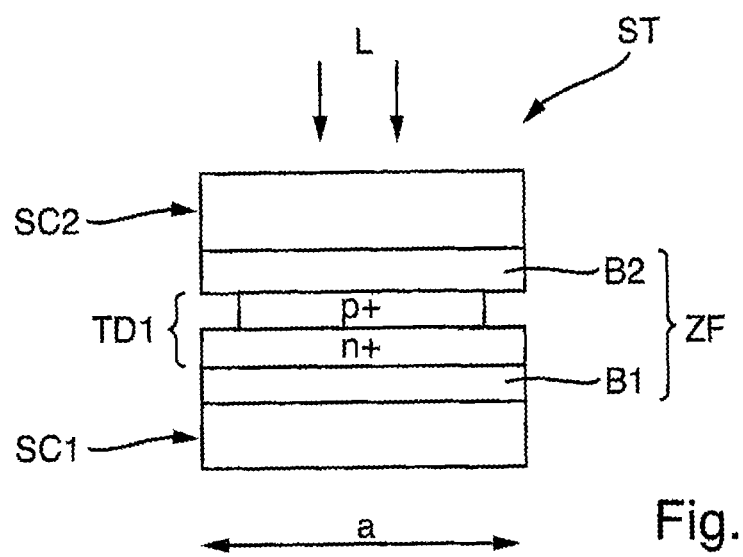
FIG. 1 shows a solar cell stack comprising two subcells and comprising one tunnel diode according to the invention.

FIG. 1 shows a solar cell stack ST comprising a first subcell SC1 and a second subcell SC2 and comprising a tunnel diode TD1 according to the invention. Solar cell stack ST predominantly comprises III-V semiconductor layers. Light incidence L takes place through second solar cell SC2.

The size of lattice constant a is depicted by an arrow below illustrated solar cell stack ST. In other words, the illustrated lateral extension of the individual layers, i.e. the extension in the direction of the arrow, corresponds to the size of the lattice constant.

First subcell SC1 has a first band gap having a first lattice constant. Second subcell SC2 has a second band gap having a second lattice constant. Second subcell SC2 preferably has a band gap which is equal in size to or larger than first subcell SC1.

An intermediate layer sequence ZF is disposed between the two subcells SC1 and SC2. Intermediate layer sequence ZF includes a first barrier layer B1 and tunnel diode TD1, which includes a degenerate n+ layer having a third lattice constant and a degenerate p+ layer having a fourth lattice constant, and a second barrier layer B2, the layers being arranged in the specified order.

The fourth lattice constant is smaller than the third lattice constant. The first band gap is also smaller than the second band gap. The degenerate p+ layer has a different material composition that the degenerate n+ layer. In addition, the p+ layer has a smaller lattice constant with a lattice mismatch of at least 0.5% to the n+ layer.

The layers of tunnel diode TD1 and the other layers of intermediate layer sequence ZF, i.e. the two barrier layers B1 and B2, are not strain-compensated with respect to each other.

In the present case, the degenerate p+ layer has indium as well as carbon as the dopant.

In the present specific embodiment, which is referred to as the first alternative, first subcell SC1 and second subcell SC2 are lattice-matched to each other, i.e. both lattice constants are the same. The degenerate n+ layer is also lattice-matched to the two subcells SC1 and SC2.

As a result, solar cell stack ST has a tensile strain induced with the aid of the degenerate p+ layer.

Figure 2:
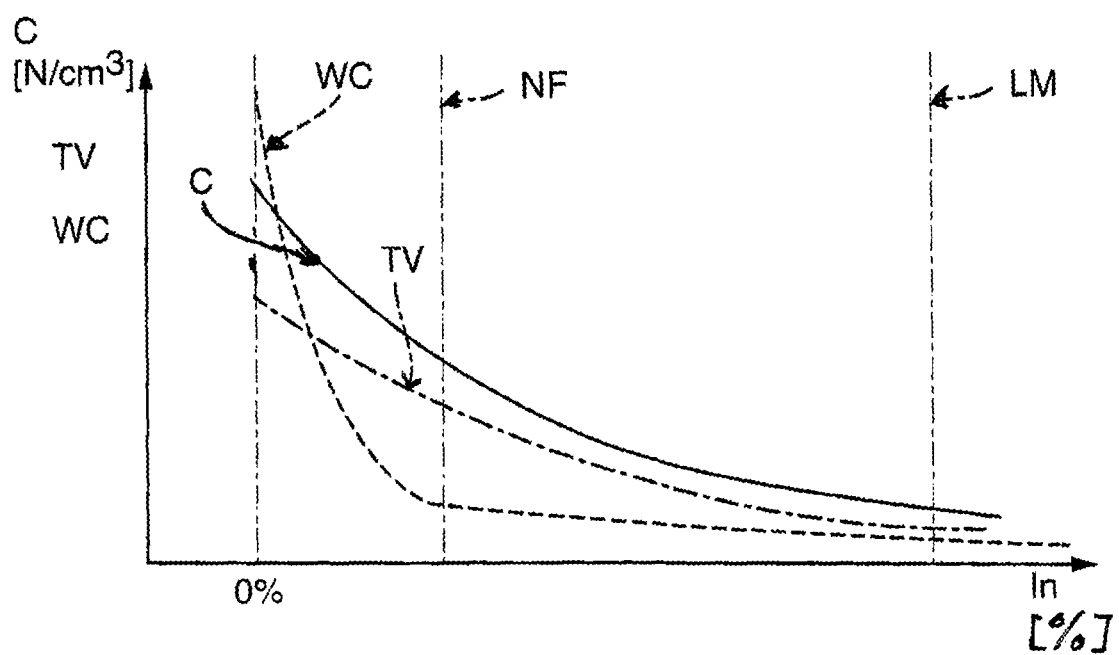
FIG. 2 shows a diagram having a qualitative relationship between the indium and carbon content as well as the transparency and relaxation probability for the degenerate p+ layer of the tunnel diode.

In the illustration in FIG. 2, the qualitative relationship between the indium and carbon content and the relaxation probability is shown for the degenerate p+ layer of the tunnel diode.

In the diagram, the abscissa qualitatively represents the indium content, while the ordinate reflects qualitative carbon content C and crack probability WC.

The solid line represents active carbon content C as a function of the indium content. The dashed line represents crack probability WC as a function of the indium content.

Transparency TV of the p+ layer as a function of the indium content is shown qualitatively by the dash-dot line.

In the event that an indium content close to 0% in the p+ layer of the tunnel diode is selected, the p+ layer has a high carbon doping. At the same time, this material is very far removed from lattice match LM to at least one of the adjacent subcells, so that crack probability WC is also very high. Transparency TV of the p+ layer, however, is high with a indium content close to 0%.

In the opposite case, the p+ layer having a high indium content is lattice-matched LM to at least one of the adjacent subcells. Accordingly, the carbon doping and the crack probability are minimized, so that the tunnel diode does not greatly disturb the crystal but no longer has a sufficient current carrying capacity.

At the same time, transparency TV of the p+ layer in the lattice-matched case is low, so that the input light is unfavorably absorbed to a greater degree in this layer.

The degenerate p+ layer of the tunnel diode according to the invention is selected in terms of the indium content at point NF in such a way that both a sufficiently high carbon doping is incorporated into the material and a low crack formation probability exists, and a sufficiently high transparency is simultaneously ensured.

It is crucial that the dependency of the crack formation probability as well as the dependency of the carbon doping and the dependency of the transparency depend on the In content in different qualitative ways.

Figure 3:
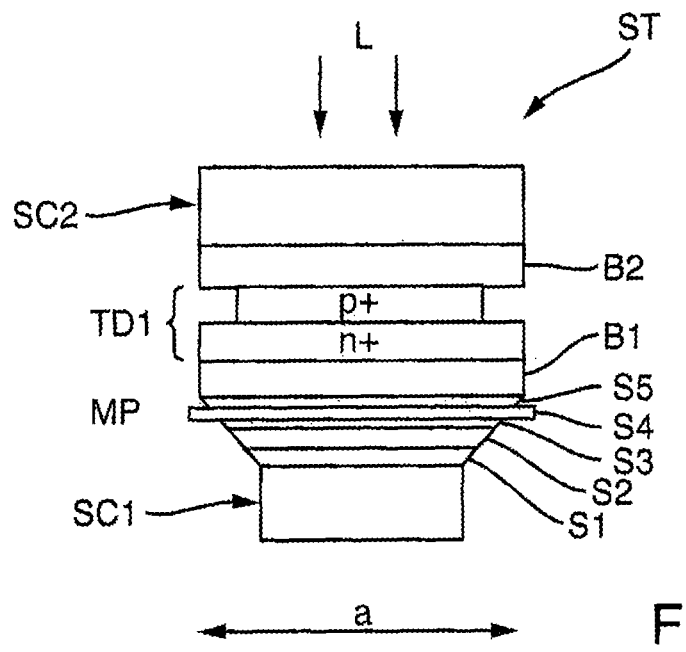
FIG. 3 shows a solar cell stack comprising two subcells and comprising one tunnel diode according to the invention and one metamorphic buffer.

In the illustration in FIG. 3, a solar cell stack ST comprising two subcells SC1 and SC2 and comprising a tunnel diode TD1 according to the invention and comprising a metamorphic buffer MP are shown according to a second alternative. Only the differences from the illustration in FIG. 1 are explained below.

First subcell SC1 has a smaller lattice constant than second subcell SC2.

A metamorphic buffer MP is formed between first subcell SC1 and second subcell SC2. In the present case, the metamorphic buffer includes a first layer S1 disposed immediately above first subcell SC1 and a second layer S2 and a third layer S3 and a fourth layer S4 and a fifth layer S5, layers S1 through S5 being arranged in the specified order.

First layer S1 is lattice-matched to first subcell SC1. Fifth layer S5 is lattice-matched to second subcell SC2. Second layer S2 has a larger lattice constant than first layer S1. Third layer S3 has a larger lattice constant than second layer S2. Fourth layer S4 has a larger lattice constant than third layer S3, while the lattice constant of fifth layer S5 is smaller than the lattice constant of fourth layer S4.

It should be noted that metamorphic buffers MP may also be formed with more or fewer than five layers.

Tunnel diode TD1 is disposed between metamorphic buffer MP and second subcell SC2.

The degenerate n+ layer of tunnel diode TD1 is lattice-matched to second subcell SC2. The degenerate p+ layer of tunnel diode TD1 is not lattice-matched to either first subcell SC1 or to second subcell SC2.

Figure 4:
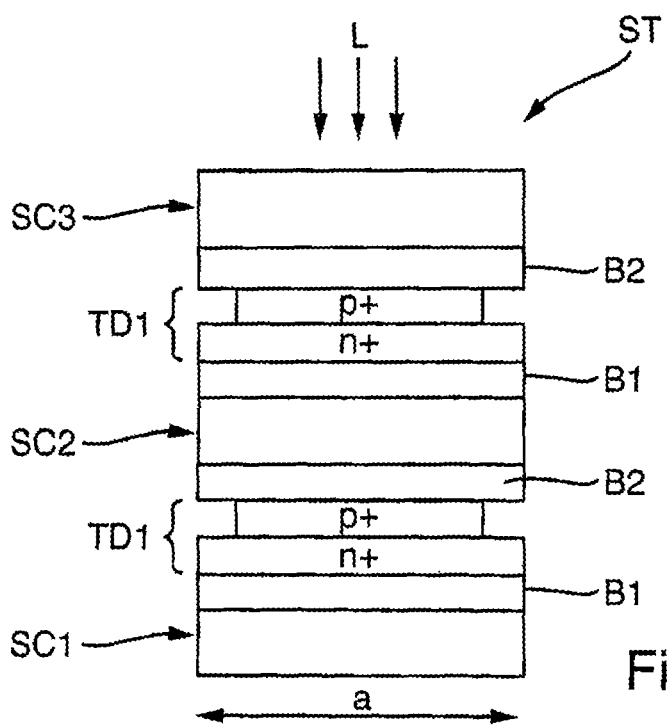
FIG. 4 shows a solar cell stack comprising three subcells and comprising two tunnel diodes according to the invention.

A solar cell stack ST comprising three subcells SC1 through SC3 and comprising two tunnel diodes TD1 according to the invention is shown in the illustration in FIG. 4. Only the differences from the illustration in FIG. 1 are explained below.

All three subcells SC1 through SC3 of solar cell stack ST are lattice-matched to each other.

Another intermediate layer sequence comprising another first barrier layer B1 and another tunnel diode TD1 and another second barrier layer B2 is disposed above second subcell SC2.

A third subcell SC3 is disposed above the additional intermediate layer sequence. Light incidence L takes place through third subcell SC3.

Due to the fact that two strained tunnel diodes TD1 are integrated, the tensile strain induced with the aid of the two p+ layers is added.

Figure 5:
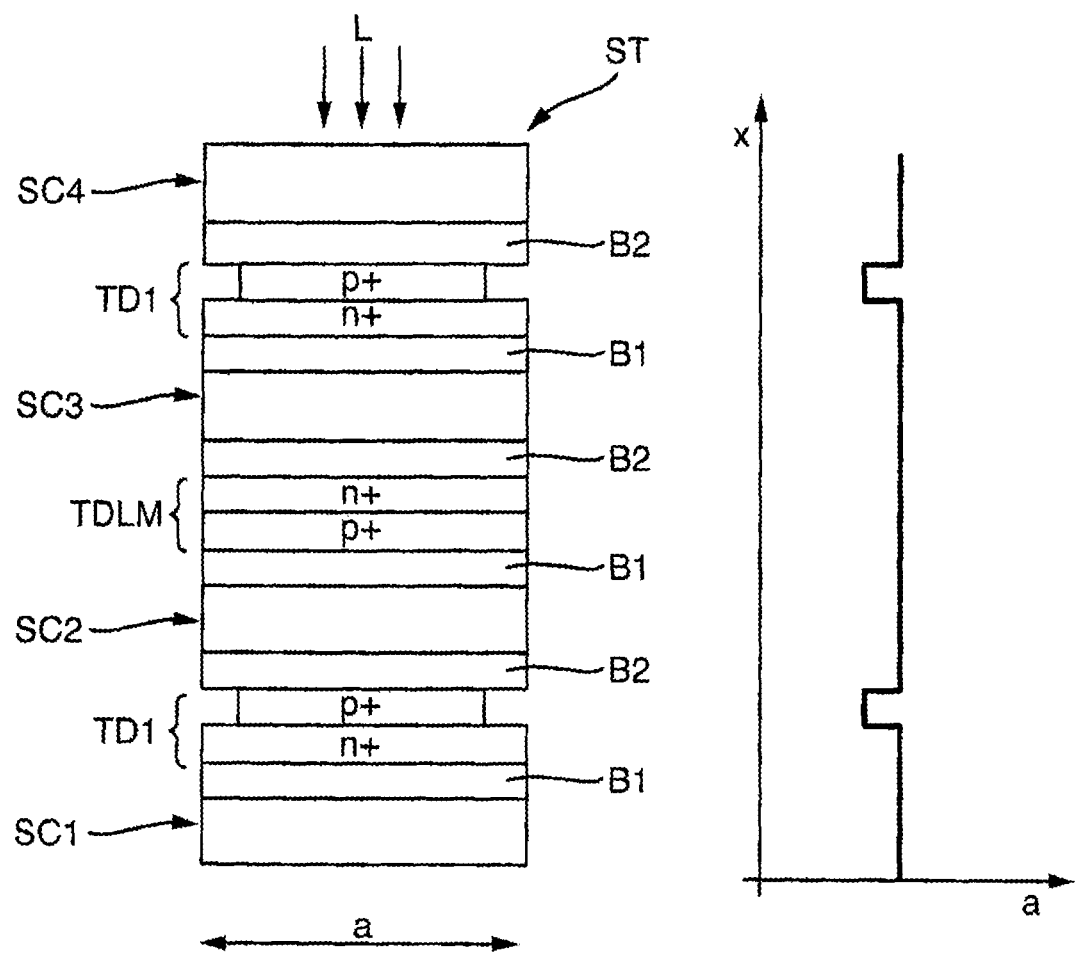
FIG. 5 shows a solar cell stack comprising two subcells and comprising two tunnel diodes according to the invention and one tunnel diode.

A solar cell stack ST comprising four subcells SC1 through SC4 and comprising two tunnel diodes TD1 according to the invention and one unstrained tunnel diode TDLM is shown in the illustration in FIG. 5. Only the differences from the illustration in FIG. 4 are explained below.

A fourth subcell SC4 is disposed above the additional intermediate layer sequence. Light incidence L takes place through fourth subcell SC4. All four subcells SC1 through SC4 of solar cell stack ST are lattice-matched to each other.

An unstrained tunnel diode TDLM is disposed between second subcell SC2 and third subcell SC3. Both degenerate layers of tunnel diode TDLM are lattice-matched to subcells SC1 through SC4.

Due to the fact that two strained tunnel diodes TD1 are integrated, the tensile strain induced with the aid of the two p+ layers is added, like in the specific embodiment illustrated in FIG. 4.

To illustrate the lattice match, the course of the height of the lattice constant is also shown to the right of the representation of solar cell stack ST. It is apparent that a tensile strain results in each of the two strained tunnel diodes TD1, so that the solar cell stack as a whole has the sum of the tensile strains from the two strained tunnel diodes TD1 at least in a first approximation.

Figure 6:
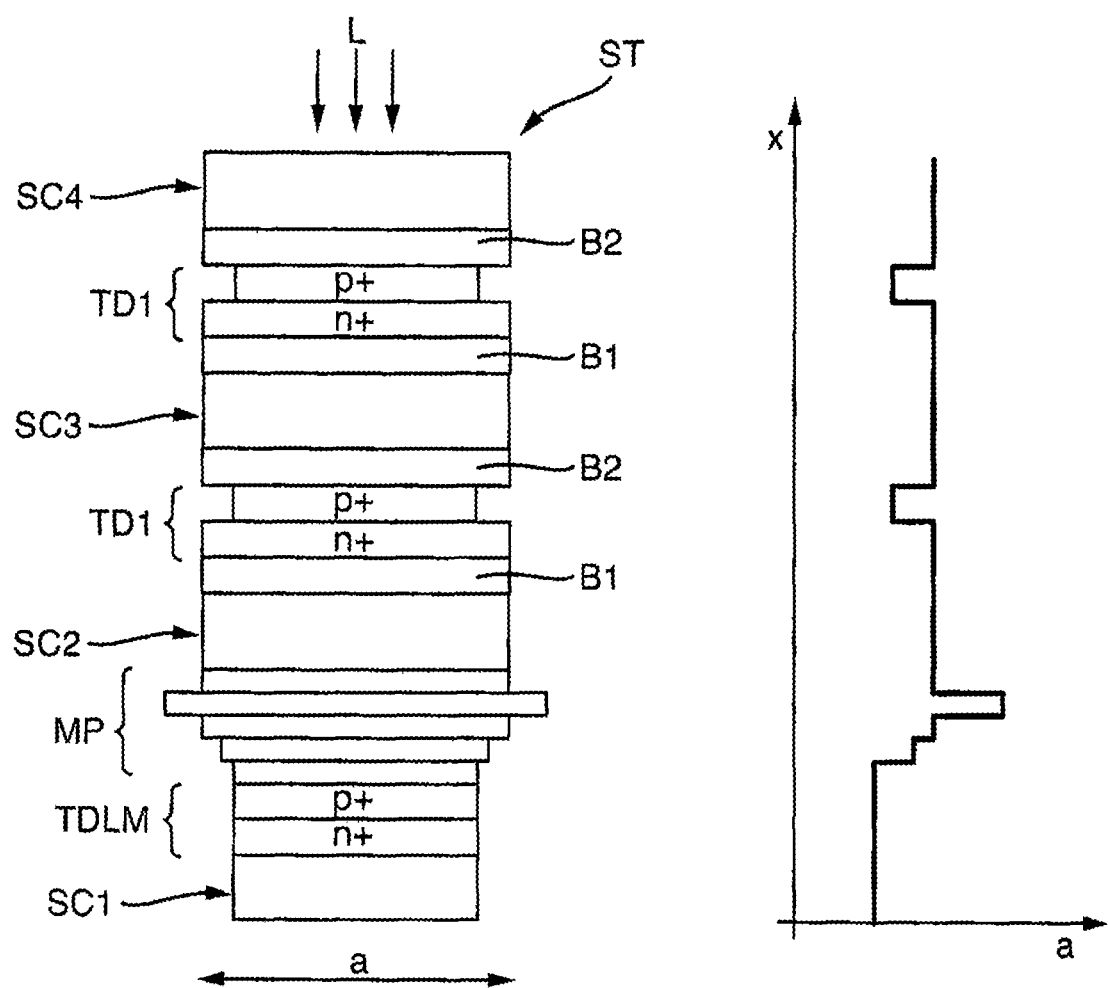
FIG. 6 shows a solar cell stack comprising four subcells and comprising two tunnel diodes according to the invention and one tunnel diode and one metamorphic buffer.

A solar cell stack ST comprising four subcells SC1 through SC4 and comprising two tunnel diodes TD1 according to the invention and one metamorphic buffer MP is shown in the illustration in FIG. 6. Only the differences from the illustration in FIG. 3 and FIG. 5 are explained below.

The three subcells SC2 through SC4 of solar cell stack ST are lattice-matched to each other above metamorphic buffer MP.

Tunnel diode TDLM is disposed between first subcell SC1 and metamorphic buffer MP.

A first strained tunnel diode TD1 is disposed between second subcell SC2 and third subcell SC3, and another second strained tunnel diode TD1 is disposed between third subcell SC3 and fourth subcell SC4.

In the illustration of the course of lattice constant a to the right of the stack, it is clearly apparent that the compressive strain induced by the large lattice constant of fourth layer S4 of metamorphic buffer MP may be easily compensated, at least partially or completely, without any additional layers, with the aid of the two tensilely strained tunnel diode layers of TD1.

Figure 7:
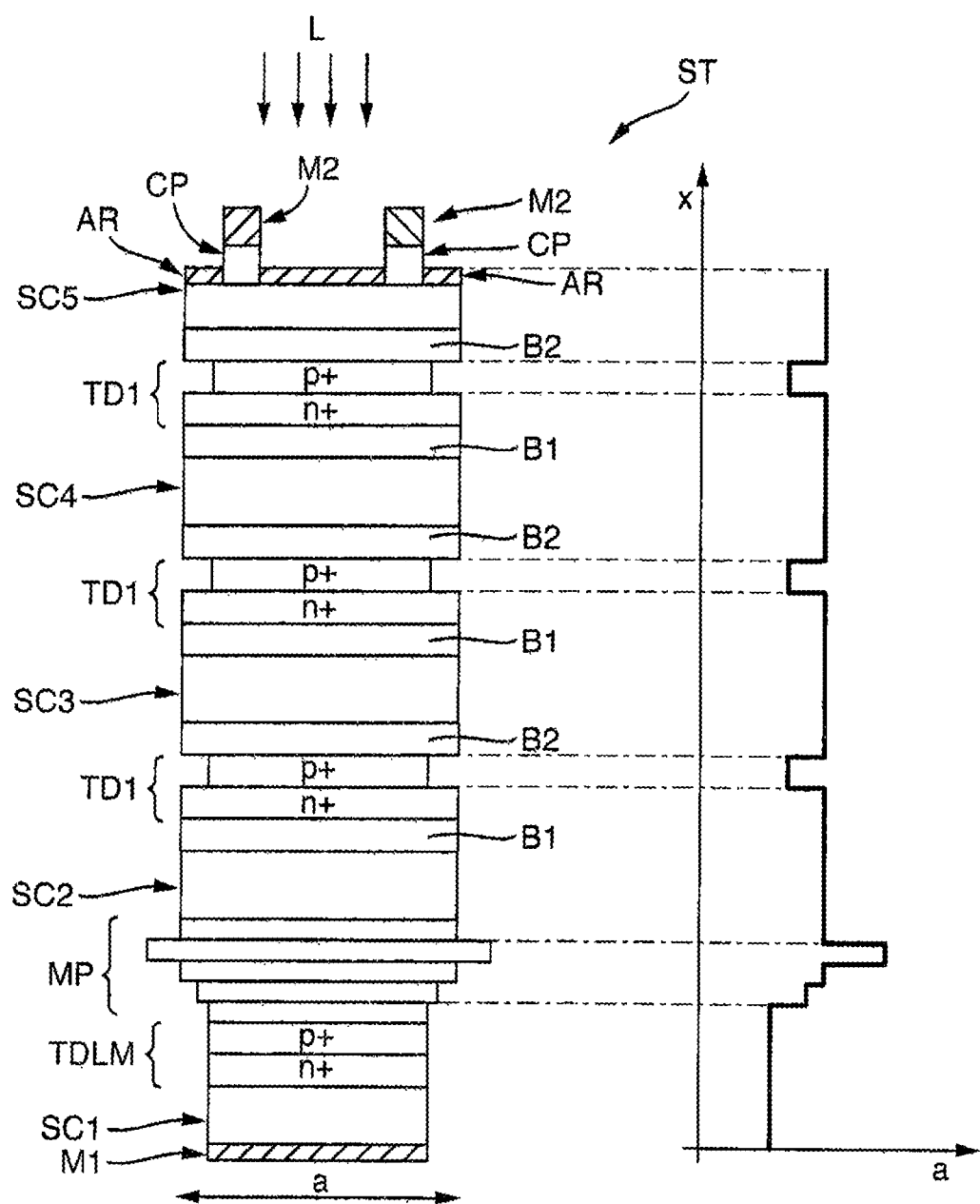
FIG. 7 shows a solar cell stack comprising five subcells and comprising three tunnel diodes according to the invention and one tunnel diode and one metamorphic buffer.

A solar cell stack ST comprising five subcells SC1 through SC5 and comprising three tunnel diodes TD1 according to the invention and one metamorphic buffer MP and one unstrained tunnel diode TDLM is shown in the illustration in FIG. 7. Only the differences from the illustration in FIG. 6 are explained below.

Another lattice-matched, fifth subcell SC5 is formed above fourth subcell SC4. In other words, second subcell SC2, up to and including fifth subcell SC5, of solar cell stack ST are lattice-matched to each other.

Another third strained tunnel diode TD1 is disposed between fourth subcell SC4 and fifth subcell SC5.

In the illustration of the course of lattice constant a to the right of the stack, it is apparent that the compressive strain induced by the large lattice constant of fourth layer S4 of metamorphic buffer MP may be easily compensated, at least partially or completely, without any additional layers, with the aid of the three tensilely strained tunnel diode layers of TD1.

A first metal contact connecting layer M1, which covers the entire surface, is formed on the underside of solar cell stack ST. An anti-reflection layer AR is applied with the aid of a mask process on the upper side of solar cell stack ST, i.e. the side on which light L first strikes solar cell stack ST.

The anti-reflection layer is interrupted for the formation of a finger-like printed conductor structure. The printed conductor structure includes an electrically conductive terminating layer CP disposed on the upper side of fifth subcell SC5 and a second metal contact connecting layer M2 formed above the connecting layer.

It is understood that it is advantageous to dispose a distributed Bragg reflector below a subcell to increase the radiation stability in the aforementioned specific embodiments. Integrating a distributed Bragg reflector makes it possible to reduce the layer thicknesses of the particular subcell by at least 30% compared to a subcell without a distributed Bragg reflector.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell stack formed of III-V semiconductor layers, the solar cell stack comprising:
    a first subcell having a first band gap and having a first lattice constant; and
    a second subcell having a second band gap and having a second lattice constant; and
    an intermediate layer sequence disposed between the first subcell and the second subcell, the intermediate layer sequence including a first barrier layer and a tunnel diode and a second barrier layer, the tunnel diode including a degenerate n+ layer having a third lattice constant and a degenerate p+ layer having a fourth lattice constant, the fourth lattice constant being smaller than the third constant, and the first band gap being smaller than the second band gap, and the p+ layer having a different material composition than the n+ layer,
    wherein the p+ layer contains at least 5 atomic percent of indium and contains carbon as the dopant,
    wherein the layers of the tunnel diode and the other layers of the intermediate layer sequence are not strain-compensated with respect to each other, and
    wherein the first subcell and the second subcell are lattice-matched to each other, and the degenerate p+ layer has a lattice mismatch of at least 0.5%, and the lattice constant of the p+ layer has a smaller lattice constant than the first lattice constant and the second lattice constant, and the third lattice constant of the degenerate n+ layer is lattice-matched to the first lattice constant or to the second lattice constant.

2. The solar cell stack according to claim 1, wherein the degenerate p+ layer of the tunnel diode has a lattice mismatch between 0.5% and 2.0% with respect to the degenerate n+ layer of the tunnel diode.

3. The solar cell stack according to claim 1, wherein the degenerate p+ layer of the tunnel diode comprises an AlInGaAs material composition or is made up of a material composition of AlInGaAs, the carbon concentration in the material being greater than $1E19\ cm^{-3}$.

4. The solar cell stack according to claim 1, wherein the indium content of the degenerate p+ layer of the tunnel diode, made up of AlInGaAs, is between 5% 5 atomic percent and 20% 20 atomic percent, and the aluminum content of the degenerate p+ layer of the tunnel diode is between 10% and 80%.

5. The solar cell stack according to claim 1, wherein the lattice constant of the degenerate p+ layer of the tunnel diode is between 5,674 Å and 5,734 Å.

6. The solar cell stack according to claim 1, wherein the degenerate p+ layer of the tunnel diode does not contain any antimony or up to a maximum of 5 atomic percent of antimony.

7. The solar cell stack according to claim 1, wherein the degenerate n+-conducting layer of the tunnel diode is made up of a compound of InGaP or AlInGaP or AlInP and is doped with tellurium, silicon, selenium or germanium, and the lattice constant is between 5,714 Å and 5,785 Å.

8. The solar cell stack according to claim 7, wherein the indium content of the degenerate n+ layer of the tunnel diode is between 63 and 80 atomic percent, and the aluminum content is up to 37%.

9. The solar cell stack according to claim 1, wherein the solar cell stack comprises a Ge or GaAs substrate.

10. The solar cell stack according to claim 9, wherein the Ge substrate includes an n+ layer and forms a Ge subcell as the bottom subcell.

11. The solar cell stack according to claim 1, the solar cell stack further comprising: a plurality of tunnel diodes including the tunnel diode, one of the plurality of tunnel diodes being situated between two subcells in each case in the solar cell stack, three of at least four subcells being disposed above a metamorphic buffer in the solar cell stack.

12. The solar cell stack according to claim 1, the solar cell stack further comprising: a plurality of tunnel diodes including the tunnel diode, one of the plurality of tunnel diodes being situated once between a metamorphic buffer and subcells located thereover in the solar cell stack and being situated once to twice between two adjacent subcells in the solar cell stack, three of at least four subcells in the solar cell stack being disposed above the metamorphic buffer.

13. The solar cell stack according to claim 1, the solar cell stack further comprising: a plurality of tunnel diodes including the tunnel diode, one of the plurality of tunnel diodes being situated between two subcells in each case in the solar cell stack, four of at least five subcells in the solar cell stack being disposed above the metamorphic buffer.

14. The solar cell stack according to claim 1, the solar cell stack further comprising: a plurality of tunnel diodes including the tunnel diode, one of the plurality of tunnel diodes being situated once between a metamorphic buffer and the subcell located thereover in the solar cell stack and being situated once to three times between two adjacent subcells in the solar cell stack, four of at least five subcells being disposed above the metamorphic buffer in the solar cell stack.

15. The solar cell stack according to claim 1, wherein layers of a metamorphic buffer in the second specific embodiment are made up of material compositions of InGaAs and/or AlInGaAs and/or InGaP, and the metamorphic buffer has a sequence of at least three layers, and the lattice constant increases from layer to layer in the sequence in the direction of the second subcell, and the lattice constants of the layers of the metamorphic buffer being larger than the lattice constant of the first subcell, and one layer of the metamorphic buffer having a fifth lattice constant, and the fifth lattice constant being larger than the lattice constant of the second subcell.

16. The solar cell stack according to claim 1, wherein the p+ layer of the tunnel diode is not strain-compensated by a subsequent layer in the solar cell stack.

17. The solar cell stack according to claim 1, wherein the solar cell stack has a monolithic design.

18. The solar cell stack according to claim 1, wherein the tunnel diode is arranged between the first barrier layer and the second barrier layer.

19. A solar cell stack formed of III-V semiconductor layers, the solar cell stack comprising:
a first subcell having a first band gap and having a first lattice constant; and
a second subcell having a second band gap and having a second lattice constant; and
an intermediate layer sequence disposed between the first subcell and the second subcell, the intermediate layer sequence including a first barrier layer and a tunnel diode and a second barrier layer, the tunnel diode including a degenerate n+ layer having a third lattice constant and a degenerate p+ layer having a fourth lattice constant, the fourth lattice constant being smaller than the third constant, and the first band gap being smaller than the second band gap, and the p+ layer having a different material composition than the n+ layer,
wherein the p+ layer contains at least 5% 5 atomic percent of indium and contains carbon as the dopant,
wherein the layers of the tunnel diode and the other layers of the intermediate layer sequence are not strain-compensated with respect to each other, and
wherein a metamorphic buffer is formed between the first subcell and the second subcell, the p+ layer of the tunnel diode not being lattice-matched to either the first subcell or to the second subcell, and the fourth lattice constant being between the first lattice constant and the second lattice constant, the degenerate n+ layer being lattice-matched to the first subcell or to the second subcell.

* * * * *